United States Patent
Liu et al.

(10) Patent No.: US 7,329,550 B2
(45) Date of Patent: Feb. 12, 2008

(54) METHOD FOR ANALYZING THE STRUCTURE OF DEEP TRENCH CAPACITORS AND A PREPARATION METHOD THEREOF

(75) Inventors: Hsien-Wen Liu, Taipei (TW); Eugene Cheng, Zhonghe (TW); Jen-Lang Lue, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 388 days.

(21) Appl. No.: 11/031,075

(22) Filed: Jan. 10, 2005

(65) Prior Publication Data

US 2006/0094132 A1 May 4, 2006

(30) Foreign Application Priority Data

Oct. 29, 2004 (TW) .............................. 93133091 A

(51) Int. Cl.
*H01L 21/66* (2006.01)
(52) U.S. Cl. .......................................... 438/14; 438/16
(58) Field of Classification Search .................. 438/14, 438/16, 243; 257/48
See application file for complete search history.

(56) References Cited

U.S. PATENT DOCUMENTS

| | | | | |
|---|---|---|---|---|
| 5,064,498 A | * | 11/1991 | Miller | .......................... 438/16 |
| 6,162,735 A | * | 12/2000 | Zimmermann et al. | ..... 438/712 |
| 6,245,587 B1 | * | 6/2001 | Vallett | .......................... 438/18 |
| 6,288,558 B1 | * | 9/2001 | Zimmermann et al. | ..... 324/754 |
| 6,403,439 B1 | | 6/2002 | Lee | |

* cited by examiner

*Primary Examiner*—Tuan H. Nguyen
(74) *Attorney, Agent, or Firm*—Rosenberg, Klein & Lee

(57) ABSTRACT

A method for analyzing the structure of deep trench capacitors and a preparation method thereof are described. A protective layer is formed on a selected inspection area. Overlying circuit layers and an upper portion of a substrate, surrounding the selected inspection area, of the die are removed. A chemical etchant is used to selectively remove the exposed substrate material to uncover deep trench capacitors. A structural analysis of those deep trench capacitors is then performed.

8 Claims, 3 Drawing Sheets

METHOD FOR ANALYZING THE STRUCTURE OF DEEP TRENCH CAPACITORS AND A PREPARATION METHOD THEREOF

RELATED APPLICATIONS

The present application is based on, and claims priority from, Taiwan Application Serial Number 93133091, filed on Oct. 29, 2004, the disclosure of which is hereby incorporated by reference herein in its entirety.

BACKGROUND OF THE INVENTION

1. Field of Invention

The present invention relates to a method of fabricating semiconductor circuit structures. More particularly, the present invention relates to a method for analyzing deep trench (DT) capacitors and a preparation method thereof.

2. Description of Related Art

With increases in the density of semiconductor integrated circuits (IC), the dimensions of semiconductor devices have decreased. One method for densifying the integration of semiconductor integrated circuits is to use trench capacitors. However, many structural defects occur when manufacturing the trench capacitors, causing many problems in the semiconductor integrated circuits.

A conventional structural analysis method for trench capacitors is to use a focused ion beam (FIB) to mill the overlying circuits on a die layer-by-layer from the top to the bottom. An inspection using an electron microscope is performed on every layer. However, since the dimensions of these trench capacitors are quite small, the overlying circuits are easily over-milled. Consequently, the structural defects are often milled away before they can be inspected, making the ability to detect such structural defects more challenging.

Recently, U.S. Pat. No. 6,403,439 has disclosed a structural analysis method for deep trench capacitors. First, chemical mechanical polishing (CMP) is performed to remove the first part from the backside of the substrate. Then, a chemical etchant is used to remove the remainder of the substrate, leaving the three-dimensional structures of the deep trench capacitors exposed to facilitate structural analysis. However, this method entails removing a lot of material. Furthermore, the removal depth of the CMP is not easy to control; hence, the deep trench structure is easily destroyed.

SUMMARY OF THE INVENTION

In one aspect, the present invention provides a preparation method to expose the three-dimensional structure of deep trench capacitors for their inspection.

In another aspect, the present invention provides a structural analysis method for inspecting the three-dimensional structure of deep trench capacitors.

In accordance with the foregoing and other aspects of the present invention, a preparation method for inspecting deep trench capacitors is provided. This method comprises the following steps. A protection layer is deposited on a selected inspection area on a die. The die comprises a substrate, an integrated circuit on the substrate, and deep trench capacitors in the substrate. The integrated circuit is removed and a surface layer of the substrate surrounding the selected inspection area is removed to a certain depth. Then, a chemical etchant is used to selectively etch the substrate to fully expose the deep trench capacitors for inspecting the deep trench capacitors' structure.

According to a preferred embodiment of the present invention, the upper circuit layers of the integrated circuit can be removed by wet etching, dry etching or hand polishing before depositing the protection layer. The integrated circuits and the surface layer of the substrate can be removed by a focused ion beam.

According to another preferred embodiment of the present invention, the protection layer is, for example, a platinum layer, a tungsten layer, a carbide layer or an oxide layer.

According to yet another preferred embodiment of the present invention, the chemical etchant is xenon fluoride ($XeF_2$) when the substrate is a silicon substrate.

In accordance with the foregoing and other aspects of the present invention, a structural analysis method of deep trench capacitors is provided. After exposing the structure of the deep trench capacitors by the method described above, an electron microscope is used to analyze the structure of the deep trench capacitors.

In light of the foregoing, this invention can reveal the three-dimensional structure of deep trench capacitors under an electron microscope to allow inspection personnel to analyze the three-dimensional structure of deep trench capacitors. Hence, the defects of deep trench capacitors can be more easily inspected without removing a lot of material. Furthermore, the results of the inspection can be provided to the process on production lines for adjusting related process parameters.

It is to be understood that both the foregoing general description and the following detailed description are made by use of examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
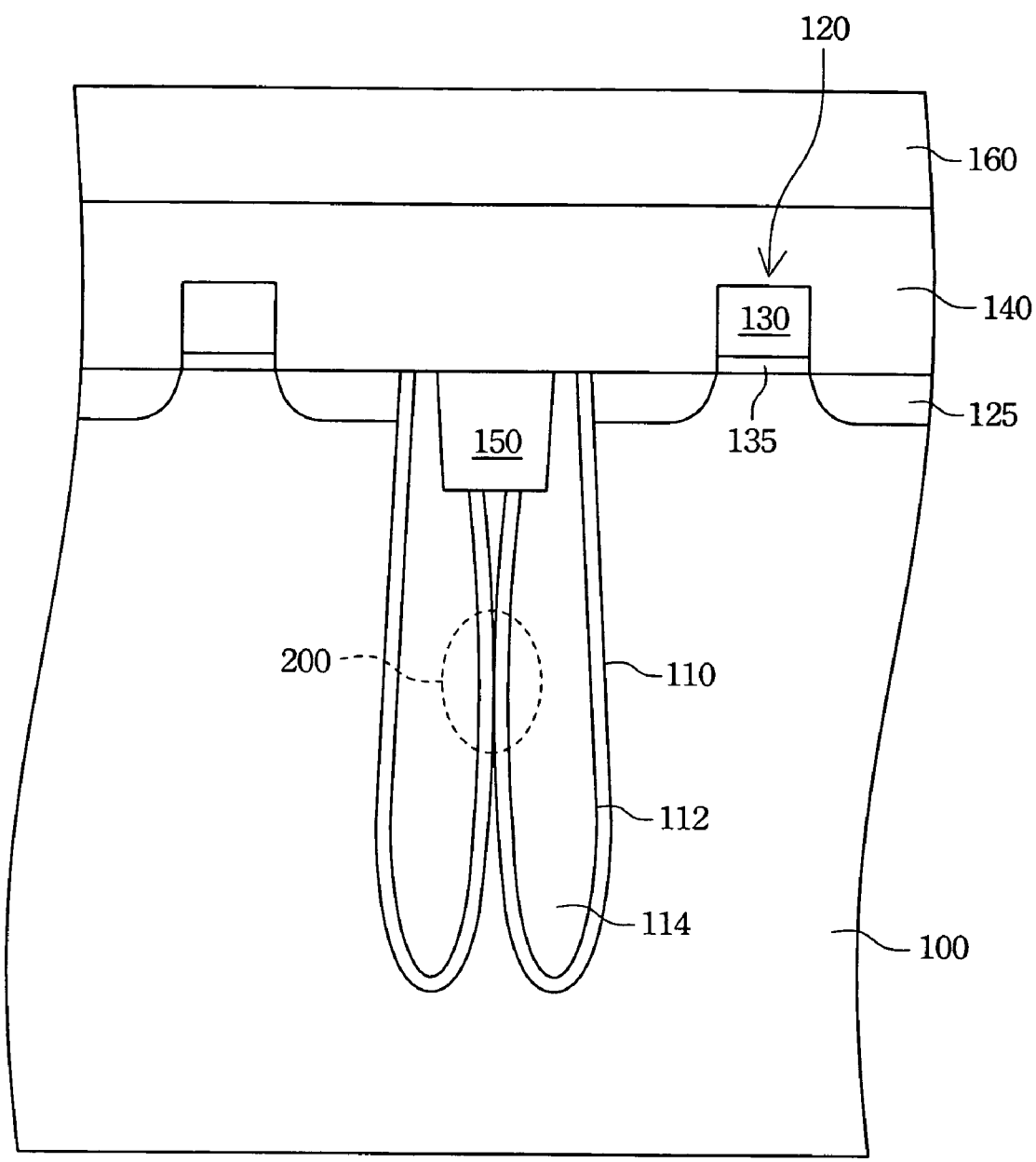
FIG. 1 is a cross-sectional diagram (taken along line I-I' of FIG. 2) showing is that a protection layer is deposited on a selected inspection area on a die according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

This invention provides a method for analyzing the structure of deep trench capacitors and a preparation method thereof. Accordingly, the three-dimensional structure of deep trench capacitors is exposed to facilitate inspection.

A die of dynamic random accessed memory (DRAM) is used as an example for illustration. First, a failed address is selected as an inspection area. Then, the upper circuit layers are removed to leave the first circuit layer, such as metal-oxide-semiconductor (MOS) transistors and contacts, on the die to physically locate the failed position more precisely. The removal method comprises, for example, wet etching, dry etching or hand polishing. However, the removal step can also be omitted to deposit a protection layer on the die directly.

The circuit structure remaining after the removal of the upper circuit layers is depicted in FIG. 1. FIG. 1 is a cross-sectional diagram showing that a protection layer is deposited on a selected inspection area on a die according to one preferred embodiment of this invention. In FIG. 1, deep trench capacitors 110, comprising dielectric layers 112 and poly-silicon plugs 114, are in the substrate 100. The poly-silicon plugs 114 are the top electrodes of the deep trench capacitors 110. Shallow trench isolation (STI) 150 in the substrate 100 is used to isolate adjacent MOS transistors 120. The MOS transistor 120 has source/drains 125, a gate 130 and a gate dielectric 135. A first insulation layer 140 covers the MOS transistors 120, and contacts located therein respectively connect different source/drains 125 to an upper circuit layer. For simplicity, these contacts are not shown in FIG. 1.

Figure 2:
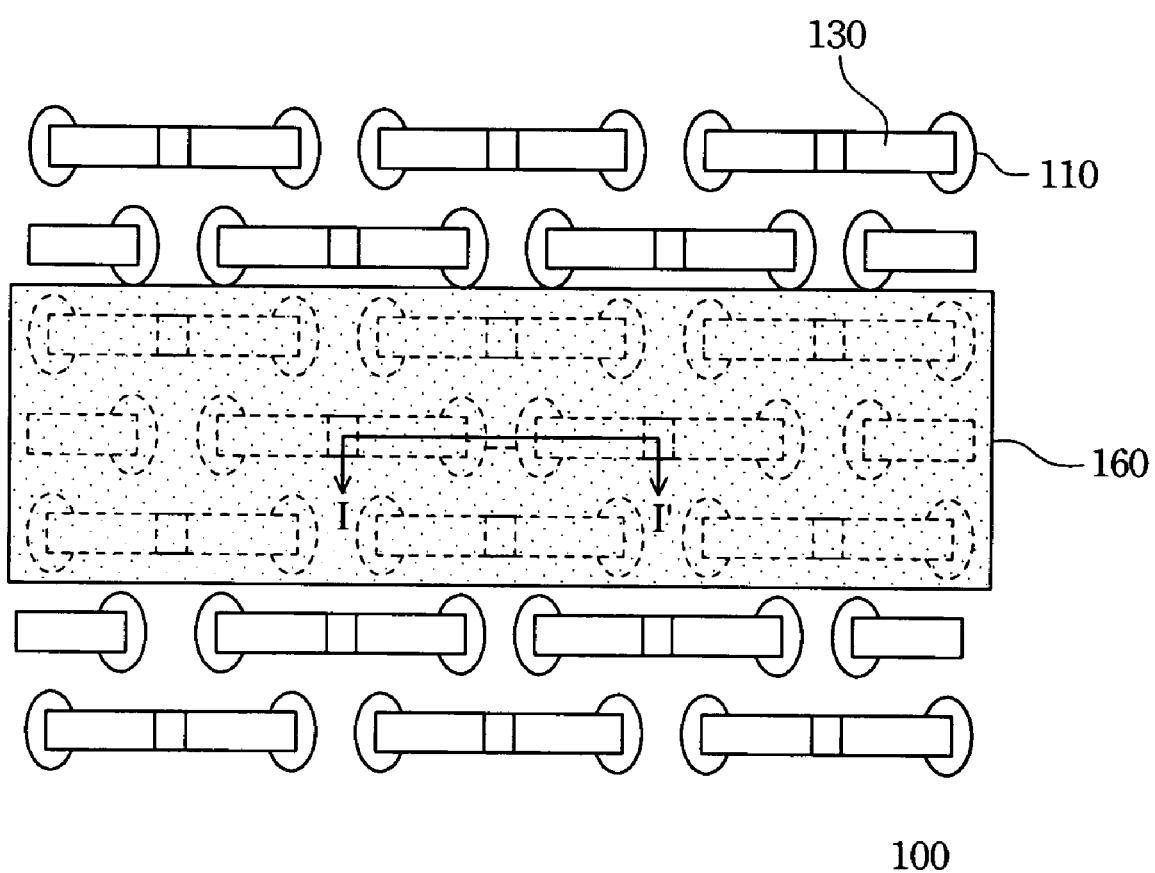
FIG. 2 is a diagram showing the top view of FIG. 1.

FIG. 2 is the top view of the foregoing circuit, of which the sectional line I-I' is displayed in FIG. 1. Referring to FIGS. 1 and 2 simultaneously, a protection layer 160 is deposited on the selected inspection area. The material of the protection layer 160 can be platinum, tungsten, carbide or oxide. The 10 deposition method can be physical vapor deposition (PVD) or chemical vapor deposition (CVD).

Figure 3:
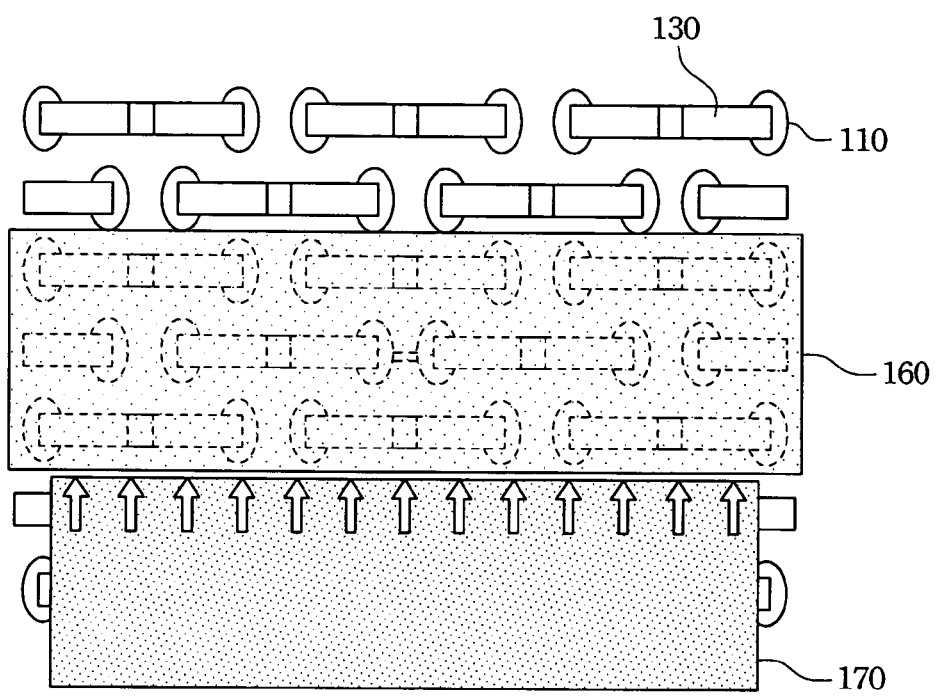
FIG. 3 is a diagram showing that the integrated circuit on one side of the protection layer is etched according to one preferred embodiment of this invention.

FIG. 3 is a diagram showing that the integrated circuit on one side of the protection layer is etched according to one preferred embodiment of this invention. The insulation layer 140, the MOS transistors 120 and the substrate 100 in region 170 on one side of the protection layer 160 are milled away one layer at a time by, for example, a focused ion beam (FIB) scanning from side to side and indexing in the direction shown by the arrows in FIG. 3 until a certain depth is reached.

Figure 4:
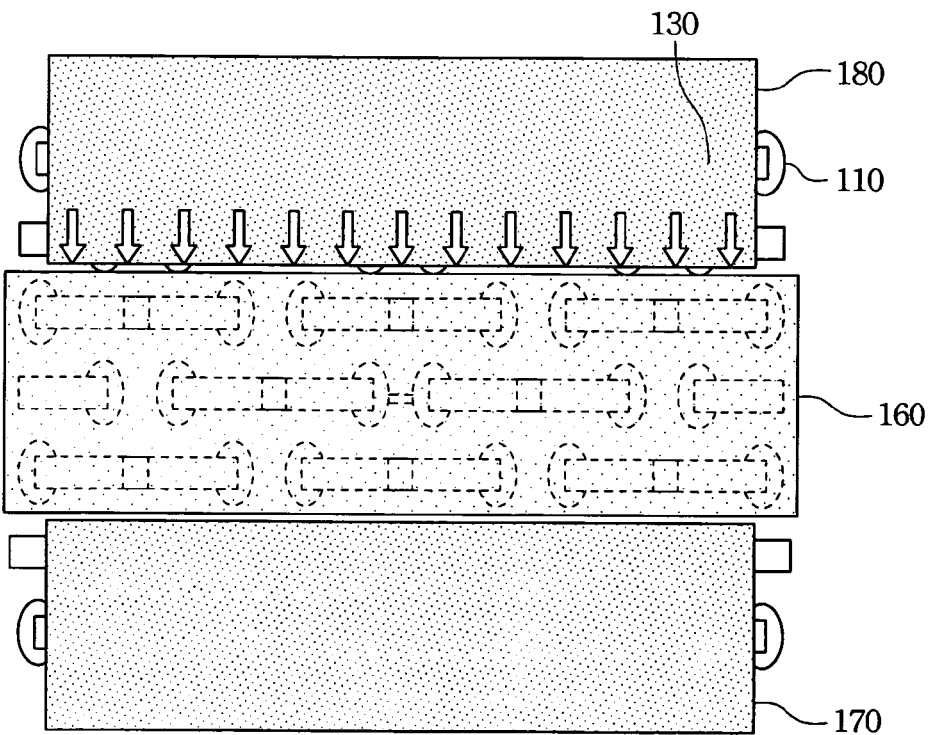
FIG. 4 is a diagram showing that the integrated circuit on another side of the protection layer is etched according to one preferred embodiment of this invention.

FIG. 4 is a diagram showing that the integrated circuit on another side of the protection layer is etched according to the preferred embodiment of this invention. The insulation layer 140, the MOS transistors 120 and the substrate 100 in region 180 on another side of the protection layer 160 can be milled in the same manner as described above.

The etched depth, as described above, of the substrate 100 is deeper than about 7 μm and is preferably about 10-15 μm to facilitate observation of the deep trench structure.

Furthermore, if a two-stage milling operation is performed, the selected inspection area 160 can be excavated more precisely. At the first stage of milling, a rough milling is performed to quickly remove the outer portions of the regions 170 and 180. The inner portions, which are adjacent to the protection layer 160, of the regions 170 and 180 are removed by fine milling to slow down the milling rate. Hence, the insulation layer 140, the MOS transistor 120 and a surface layer of the substrate 100 in regions 170 and 180 can be precisely removed.

Then, a chemical etchant is used to selectively etch the exposed substrate 100 to uncover the deep trench capacitors 110 under the protection layer 160. For example, when a material of the substrate 100 is silicon, xenon fluoride ($XeF_2$), which has high affinity for silicon, can be the chemical etchant to selectively remove the silicon substrate for about 30 seconds to about 5 minutes. The outer layer of the deep trench capacitors 110 is the dielectric layer 112, for which $XeF_2$ has much less affinity than for silicon. Therefore, the dielectric layer 112 can protect the structure of the deep trench capacitors 110 to keep them intact. Consequently, the three-dimensional structure of the deep trench capacitors 110 can be fully exposed when the substrate 100 nearby is etched away.

Next, an electron microscope, such as a scanning electron microscope, can be used to inspect and perform structural analysis of the exposed deep trench capacitors 110. Thus, structural defects, such as the structural defect 200 in FIG. 1, can be easily inspected. The structural defect 200 in FIG. 1 often causes a short circuit between neighboring deep trench capacitors.

Generally speaking, an electrical test is performed before the inspection and structural analysis as described above. The electrical test can determine the failed address, after which the physical position of the failed address can be found. The method provided by this invention is used hereafter to protect the physical position of the failed address by means of the protection layer. After performing the following steps, the three-dimensional structure of the deep trench capacitors in the failed address can be inspected and analyzed.

In light of the foregoing, the preferred embodiment of this invention deposits a protection layer on the selected inspection area to protect the underlying deep trench capacitors. Then, the circuit and a surface layer of the substrate surrounding the selected inspection area are removed. Next, a chemical etchant is used to selectively remove the exposed substrate to uncover the three-dimensional structure of the deep trench capacitors under the protection layer. Hence, this invention can perform structural analysis of the deep trench capacitors without removing a lot of substrate material. That is, applying this invention can easily inspect the three-dimensional structure of the deep trench capacitors to determine whether or not there are any defects and where the defects are. The structural analysis results can be further fed back to the production lines to adjust the production parameters.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structural analysis method of deep french capacitors, the structural analysis method comprising:

depositing a protection layer on a selected inspection area on a die, the die comprising a substrate, an integrated circuit on the substrate, and deep trench capacitors in the substrate;

removing the integrated circuit and a surface layer of the substrate surrounding the selected inspection area to a certain depth;

using a chemical etchant to selectively etch the substrate to fully expose the deep trench capacitors; and inspecting the deep trench capacitors by an electron microscope to perform structural analysis.

2. The structural analysis method of claim 1, further comprising removing upper circuit layers of the integrated circuit before depositing the protection layer.

3. The structural analysis method of claim 2, wherein the upper circuit layers of the integrated circuit are removed by wet etching, dry etching or hand polishing.

4. The structural analysis method of claim 1, wherein the protection layer is a platinum layer, a tungsten layer, a carbide layer or an oxide layer.

5. The structural analysis method of claim 1, wherein the integrated circuits and the surface layer of the substrate are removed by a focused ion beam.

6. The structural analysis method of claim 1, wherein the depth is greater than 7 µm.

7. The structural analysis method of claim 1, wherein the depth is about 10-15 µm.

8. The structural analysis method of claim 1, wherein the chemical etchant comprises xenon fluoride when the substrate is a silicon substrate.

* * * * *